US008227084B2

(12) United States Patent
Choate et al.

(10) Patent No.: US 8,227,084 B2
(45) Date of Patent: *Jul. 24, 2012

(54) THERMOSETTING RESIN COMPOSITION FOR HIGH PERFORMANCE LAMINATES

(75) Inventors: Martin Choate, Onalaska, WI (US); Jyoti Sharma, Landenberg, PA (US); Steve Peters, Rockland, WI (US); Kevin Rafferty, Winona, MN (US)

(73) Assignee: Isola USA Corp., Chandler, AZ (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/773,480

(22) Filed: May 4, 2010

(65) Prior Publication Data

US 2011/0111662 A1    May 12, 2011

Related U.S. Application Data

(63) Continuation of application No. 12/417,463, filed on Apr. 2, 2009, now Pat. No. 7,713,621, which is a continuation of application No. 11/185,259, filed on Jul. 20, 2005, now Pat. No. 7,521,494, which is a continuation of application No. 10/310,418, filed on Dec. 5, 2002, now abandoned.

(60) Provisional application No. 60/337,322, filed on Dec. 5, 2001.

(51) Int. Cl.
*B32B 17/04* (2006.01)
*C08L 25/08* (2006.01)
*C08L 63/00* (2006.01)
*C08L 63/02* (2006.01)

(52) U.S. Cl. .......... 428/413; 523/464; 523/467; 525/65; 525/117

(58) Field of Classification Search .................. None
See application file for complete search history.

(56) References Cited

U.S. PATENT DOCUMENTS

| 4,456,712 | A | * | 6/1984 | Christie et al. | 523/439 |
|---|---|---|---|---|---|
| 5,008,477 | A | * | 4/1991 | Hussain | 570/208 |
| 5,030,778 | A | * | 7/1991 | Ransford | 570/208 |
| 5,160,781 | A | * | 11/1992 | Yoshioka et al. | 442/146 |
| 5,324,874 | A | * | 6/1994 | Ransford et al. | 570/208 |
| 5,401,890 | A | * | 3/1995 | Parks | 570/211 |
| 5,457,248 | A | * | 10/1995 | Mack et al. | 570/206 |
| 5,741,949 | A | * | 4/1998 | Mack | 568/639 |
| 6,063,839 | A | * | 5/2000 | Oosedo et al. | 523/206 |
| 6,117,371 | A | * | 9/2000 | Mack | 252/609 |
| 6,214,923 | B1 | * | 4/2001 | Goto et al. | 524/514 |
| 6,287,696 | B1 | * | 9/2001 | Noda et al. | 428/411.1 |
| 6,500,546 | B1 | * | 12/2002 | Heine et al. | 428/418 |
| 7,521,494 | B2 | * | 4/2009 | Choate et al. | 523/434 |
| 7,713,621 | B2 | * | 5/2010 | Choate et al. | 428/396 |
| 2003/0158337 | A1 | * | 8/2003 | Choate et al. | 525/107 |
| 2007/0178300 | A1 | * | 8/2007 | Amla et al. | 428/332 |

FOREIGN PATENT DOCUMENTS

| JP | 1-123848 | A | * | 5/1989 |
|---|---|---|---|---|
| JP | 7-216162 | A | * | 8/1995 |
| WO | WO 98/18845 | A1 | * | 5/1998 |

OTHER PUBLICATIONS

Saytex 8010 decabromodiphenylethane technical data sheet from Albemarle Corporation, 2001, two pages.*

* cited by examiner

*Primary Examiner* — Robert Sellers
(74) *Attorney, Agent, or Firm* — McDonnell Boehnen Hulbert & Berghoff LLP

(57) ABSTRACT

This invention concerns a thermosetting resin system that is useful in the manufacture of high performance prepreg, laminate and composite materials as well as, prepregs, laminates and composites made from the thermosetting resin composition.

11 Claims, No Drawings

THERMOSETTING RESIN COMPOSITION FOR HIGH PERFORMANCE LAMINATES

CROSS REFERENCE TO RELATED APPLICATIONS

This application is a continuation of U.S. application Ser. No. 12/417,463, filed on Apr. 2, 2009, now U.S. Pat. No. 7,713,621, which is a continuation of U.S. application Ser. No. 11/185,259 filed on Jul. 20, 2005, now U.S. Pat. No. 7,521,494, which is a continuation of U.S. application Ser. No. 10/310,418, filed Dec. 5, 2002 now abandoned, which claims priority from U.S. Provisional Application Ser. No. 60/337,322 filed Dec. 5, 2001, the specifications of each of which are incorporated herein by reference in their entirety.

BACKGROUND OF THIS INVENTION (1) Field of this Invention

This invention concerns a thermosetting resin system that is useful in the manufacture of high performance prepreg, laminate and composite materials as well as the prepregs, laminates and composites made from the thermosetting resin composition.

(2) Description of the Related Art

Plastics have certain mechanical and structural properties that can be improved when the plastics are combined with reinforcing components. Composites formed of various fibers embedded in a polymer resin matrix, for example, are especially useful. However, such compositions are susceptible to enormous physical property variations depending upon, for example, the nature of the fiber used, how the fiber is utilized, and the fiber matrix or binder. The uses for such composites range from airframes to tennis rackets and from boat hulls to rocket motor casings, and laminates for use, for example, as multilayer printed circuit boards in the electronics industry.

Performance requirements for composites and laminate materials are becoming more stringent. In the electronics industry, for example, high speed high frequency circuits require substrates with difficult to attain electrical properties, such as low dielectric loss and low dielectric constant. Current composite materials do not meet these electrical requirements. In addition, other materials that may exhibit favorable electrical properties do not possess the thermal properties required for composites and laminates. There exists a continuing need, therefore, for new composite materials having favorable thermal and electrical properties, such as low dielectric loss and low dielectric constant.

SUMMARY OF THIS INVENTION

This invention provides a thermosetting resin composition useful in the manufacture of high performance composite and laminate materials. The thermosetting resin composition comprises: at least one epoxy resin; at least one styrene maleic anhydride copolymer; and at least one bis-maleimide-triazine resin.

This invention also provides prepregs, laminates and composites manufactured from the disclosed thermosetting resin compositions.

DESCRIPTION OF THE CURRENT EMBODIMENT

This invention provides thermosetting resin compositions useful in the manufacture of high performance composite materials, and prepregs, laminates and composites manufactured therefrom. The compositions are particularly useful in the preparation of laminates having low dielectric constants and low dielectric loss ("low loss"). These electrical properties help solve signal speed and signal integrity problems encountered with high speed analog digital applications manufactured using laminates with prior art resin systems.

Laminate materials manufactured with the thermosetting resin compositions of the present invention can have low and flat dielectric loss ($\leq 0.01$) and low dielectric constant ($\geq 4$) at high frequency range of 2 GHz to 10 GHz, at comparatively low cost. "Flat dielectric loss" means that the dielectric loss is essentially constant over a range of frequencies. The compositions of this invention may have a dielectric loss as low as $\leq$ about 0.01 over a frequency range of from 2 to 10 GHz. (As is understood by those skilled in the art, dielectric loss and constant depend on resin content and can additionally depend on other factors, such as the substrate used in a laminate). In addition to having favorable electrical properties, prepregs prepared from the compositions of this invention are also non-tacky and easy to process.

The thermosetting resin composition includes the following ingredients: (1) at least one epoxy resin; (2) at least one styrene maleic anhydride copolymer; and (3) a bis-maleimidetriazine resin. The composition optionally includes one or more of the following: (4) a filler; (5) a toughener; (6) an accelerator; (7) a flame retardant; (8) a solvent; and/or (9) other additives.

(1) The Epoxy Resin

The term "epoxy resin" in this context refers to a curable composition of oxirane ring-containing compounds as described in C. A. May, Epoxy Resins, 2nd Edition, (New York & Basle: Marcel Dekker Inc.), 1988.

The epoxy resin is added to the resin composition in order to provide the desired basic mechanical and thermal properties of the cured resin and laminates made there from. Useful epoxy resins are those that are known to one of skill in the art to be useful in resin compositions useful for electronic composites and laminates.

Examples of epoxy resins include phenol types such as those based on the diglycidyl ether of bisphenol A ("Bis-A epoxy resin"), on polyglycidyl ethers of phenol-formaldehyde novolac or cresol-formaldehyde novolac, on the triglycidyl ether of tris(p-hydroxyphenol)methane, or on the tetraglycidyl ether of tetraphenylethane, or types such as those based on tetraglycidylmethylenedianiline or on the triglycidyl ether of p-aminoglycol; cycloaliphatic types such as those based on 3,4-epoxycyclohexylmethyl-3,4-epoxycyclohexane carboxylate. The term "epoxy resin" also includes within its scope reaction products of compounds containing an excess of epoxy (for instance, of the aforementioned types) and aromatic dihydroxy compounds. These compounds may be halogen substituted.

Preference is given to epoxy resins which are derivatives of bisphenol A ("Bis-A epoxy resin"), particularly FR4. FR4 is made by an advancing reaction of an excess of bisphenol A diglydicyl ether with tetrabromobisphenol A. Mixtures of epoxy resins with bismaleimide resin, cyanate resin and/or bismaleimide triazine resin can also be used.

It should be noted that epoxy resins are generally represented by a single, unequivocal structural formula. The skilled person will know that this should be taken to include deviating products resulting from side reactions occurring during epoxy resin preparation. As these side products constitute a normal component of cured epoxy resins, they likewise constitute a normal component of the resins according to this invention. Epoxy resins are present in the composition of this invention in an amount from about 8% to about 26%, and preferably from about 10 to about 23%, based on 100% by weight solids of the composition.

Bisphenol A (BPA) and/or bisphenol A diglycidyl ether (BPADGE) can optionally be included with the epoxy resin as co-crosslinking agents. Both the BPA and the BPADGE may optionally be brominated, i.e. substituted with one or more bromine atoms. Resin systems incorporating optionally brominated bisphenol A and optionally brominated bisphenol A diglycidyl ether that are useful in the present invention are described in U.S. Pat. No. 6,509,414, which is incorporated herein by reference in its entirety. In the present invention, the aromatic moieties of BPA and BPADGE are preferably substituted with two bromine atoms, to give tetrabromobisphenol A (TBBA) and tetrabromobisphenol A diglycidyl ether (TBBADGE), respectively. Optionally brominated novolacs can also be used as co-cross-linking agent. Brominated co-crosslinking agents are preferred because of their flame retarding properties.

The desired resin properties determine the amount of optionally brominated BPA and optionally brominated BPADGE to be incorporated into the resin. According to this invention, for instance, it has surprisingly been found that the Tg of epoxy resins cross-linked with SMA can be increased substantially by the use of at least 5% by weight of BPA. Most surprisingly of all, it is now possible, as indicated above, to obtain resins having glass transition temperatures of 130° C. and higher even with simple difunctional epoxy compounds. When a co-crosslinking agent is used, it is generally present in amount of about 5% to about 60%, preferably about 15% to about 55%, based on 100% by weight solids of the composition. In a preferred embodiment, the composition of this invention contains both TBBA and TBBADGE. In this preferred embodiment, the TBBA is present in an amount of from about 3% to about 21 wt %, preferably from about 6% to about 19%, and the TBBADGE is present in amount of from about 9 wt % to about 30 wt %, preferably from about 11 wt % to about 26 wt %, each based on 100% by weight solids of the composition.

(2) Styrene Maleic Anhydride Copolymer

The thermosetting resin compositions of this invention includes one or more styrene maleic anhydride compounds (SMA). SMA improves the thermal and electrical properties of the resulting cured polymer and products made therefrom by reacting with unreacted elastomer ingredients and by-products.

Copolymers of styrene and maleic anhydride have been described, inter alia, in *Encyclopedia of Polymer Science and Engineering* Vol. 9 (1987), page 225. Within the framework of this invention the term "copolymer" likewise refers to SMA or mixtures of SMA. Copolymers of styrene and maleic anhydrides (SMA) are commercially available in two types. Type 2 comprises mostly high-molecular weight copolymers (MW generally higher than 100,000, for instance, 1,000,000). These are in fact thermoplastics, which are unsuitable for use in the manufacture of prepregs. Moreover, because of their low anhydride content (5-15%) they are not particularly suitable for use as a crosslinking agent for epoxy resin either. The type 1 SMA copolymers, on the other hand, which have a molecular weight in the range of about 1400 to about 50,000 and an anhydride content of more than 15% by weight, are especially suited for use in compositions of this invention. Preference is also given to SMA copolymers having a molecular weight in the range of 1400 to 10,000. Examples of such copolymers include the commercially available SMA 1000, SMA 2000, SMA 3000, and SMA 4000. These copolymers have a styrene maleic anhydride ratio of 1:1. 2:1, 3.1, and 4:1, respectively, and a molecular weight ranging from about 1400 to about 2000. Mixtures of these SMAs may also be used. SMA polymers are present in the thermosetting resin compositions of this invention in an amount from about 10% to about 26%, preferably from about 15 to about 23%, based on 100% by weight solids of the composition. In one preferred embodiment, the amount of epoxy resin exceeds the amount of SMA in order to provide an excess of functionality of the epoxy over the SMA. In this embodiment, the weight ratio of epoxy resin to SMA copolymer is preferably about 2:1 to about 1.5:1 (epoxy:SMA).

(3) Bis-Maleimidetriazine Resins

The thermosetting resin compositions of this invention further includes a Bis-maleimidetriazine resin (BT). BT resins are commercially available from Mitsubishi. Bis-maleimidetriazine resins are present in the thermosetting resin compositions of this invention in an amount from about 15% to about 50%, preferably from about 25 to about 40%, based on 100% by weight solids of the composition.

(4) The Optional Filler

One or more fillers can optionally be added to the resin compositions of this invention to improve chemical and electrical properties of the cured resin. Examples of properties that can be modified with fillers include, but are not limited to, coefficient of thermal expansion, lowering CTE, increasing modulus, and reducing prepreg tack. Non-limiting examples of useful fillers include particulate forms of Teflon®, talc, quartz, ceramics, particulate metal oxides such as silica, titanium dioxide, alumina, ceria, clay, boron nitride, wollastonite, and mixtures thereof. Preferred fillers include calcined clay or fused silica. Another preferred filler is fused silica. Yet another preferred filler is silane treated silica. More preferably, the silane treated filler is fused silica treated with epoxy silane. When used, fillers are present in the thermosetting resin compositions of this invention in an amount from about 0% to about 20%, preferably from about 0 to about 10%, based on 100% by weight solids of the composition.

(5) The Optional Toughener

The thermosetting resin compositions of this invention may include one or more tougheners. The tougheners are added to the resin compositions to improve the drillability of the resulting composites and laminates. Useful tougheners include methyl methacrylate/butadiene/styrene copolymer, methacrylate butadiene styrene core shell particles, and mixtures thereof. A preferred toughener is methacrylate butadiene styrene core shell particles, which is available from Rohm & Haas (100 Independence Mall West, Philadelphia, Pa.), sold under the trade name Paraloid®. When used, tougheners are present in the thermosetting resin compositions of this invention in an amount from about 1% to about 5%, preferably from about 2 to about 4%, based on 100% by weight solids of the composition.

(6) Accelerators

One or more accelerators are typically added to the composition to crosslink the resins and to enhance the rate of resin cure. The accelerators chosen may be any accelerators that are know to speed up the rate of thermosetting resin cure. As suitable accelerators may be mentioned imidazoles, more particularly alkyl substituted imidazoles such as 2-methylimidazole and 2-ethyl-4-methylimidazole, 2-phenylimidazole, 2-phenyl, 4-methylimidazole. Other suitable accelerators include tertiary amines, e.g. benzyldimethylamine and 4,4' and 3,3' diaminodiphenylsulphone. One preferred accelerator is 2-ethyl-4-methylimidazole. The amount of accelerator used is dependent on the type of epoxy resin, the type of cross-linking agent, and the type of accelerator. Employing a too large amount of accelerator will lead to a too highly reactive resin system. The skilled person can easily determine the amount of accelerator needed to provide a resin system that is sufficiently reactive to allow ready processing into prepregs. In general, such amount will be between 0 01 and 5% by weight of accelerators, calculated on the overall weight of epoxy resin and co-crosslinking agent present in the composition. In many cases this will be the 0.01-0.05% by weight range. The resin gel is dependent on the type anal amount of accelerator, the type and amount of solvent, and the type of prepreg to be manufactured. In the specific case of 2 methylimidazole (2MI) being used as a accelerator, it is preferred not to use more than about 0.05% by weight of 2MI. By way of general guideline it can be said that it is advisable not to have a varnish gel time of less than 120 seconds.

(7) Optional Flame Retardants

The thermosetting resin compositions of this invention may include one or more flame retardants. Any flame retardant that is known to be useful in resin compositions used to manufacture composites and laminates may be used. Examples of useable flame retardants include, but are not limited to, halides of glycidyl etherified bifunctional alcohols, halides of novolac resins such as bisphenol A, bisphenol F, polyvinylphenol or phenol, creosol, alkylphenol, catecohl, and novolac resins such as bisphenol F, inorganic flame retardants such as antimony trioxide, red phosphorus, zirconium hydroxide, barium metaborate, aluminum hydroxide, and magnesium hydroxide, and phosphor flame retardants such as triphenyl phosphine, tricresyl phosphine, triethylphosphate, cresyldiphenylphosphate, xylenyl-diphenyl phosphate, acid phosphate esters, phosphate compounds containing nitrogen, and phosphate esters containing halides. Flame retardants are present in the thermosetting resin compositions of this invention in an amount of from about 3 to about 9%, preferably from about 4 to about 8%, based on 100% by weight resin solids of the composition.

Another optional flame retardant is decabromodiphenylethane, which has the following structure:

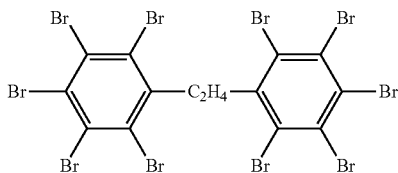

Decabromodiphenylethane is commercially available, for example, from Albemarle Corporation (451 Florida St., Baton Rouge, La. 70801). The Albemarle product is sold as Saytex™ 8010. Decabromodiphenylethane has been unexpectedly found to be easily dispersed in the resin composition. Decabromodiphenylethane also has the unexpected and synergistic result of significantly improving dielectric properties of the cured resin. As a result, the flame retardant can be included in the resin composition of this invention in amounts far greater than is necessary for a flame retardant in order to also enhance the dielectric properties of the cured resin. When decabromodiphenylethane is used as the flame retardant, it is preferably present in the thermosetting resin compositions of this invention in an amount of from about 10% to about 50%, more preferably from about 20% to about 45%, based on 100% by weight resin solids of the composition. When a brominated flame retardant is used, it is preferably present in an amount sufficient to provide a total bromine content to the composition of about 8% to about 30%, preferably about 10 to about 20%, based on 100% by weight solids of the composition.

(8) Solvents

One or more solvents are typically incorporated into the thermosetting resins of this invention in order to provide resin solubility, control resin viscosity, and in order to maintain the resin ingredients in a suspended dispersion. Any solvent known by one of skill in the art to be useful in conjunction with thermosetting resin systems can be used. Particularly useful solvents include methylethylketone (MEK), toluene, dimethylformamide (DMF), or mixtures thereof. The choice of solvent is often dictated by the resin curing method. When the resin is cured with hot air, then ketones are typically the preferred solvent. When the resins are IR cured, then a mixture of ketones and toluene is typically preferred. When used, solvents are present in the thermosetting resin compositions of this invention in an amount of from about 20% to about 50% as a weight percentage of the total weight of the composition.

Optionally, the thermosetting resin composition of the present invention may further contain other additives such as defoaming agents, leveling agents, dyes, and pigments. For example, a fluorescent dye can be added to the resin composition in a trace amount to cause a laminate prepared therefrom to fluoresce when exposed to UV light a board shop's optical inspection equipment. A useful fluorescent dye is a highly conjugated diene dye. One example of such a dye is UVITEX® OB (2,5-thiophenediylbis(5-tert-butyl-1,3-benzoxazole), available from Ciba Specialty Chemicals, Tarrytown, N.Y.

One useful composition of this invention has the following formulation:

HIGH PERFORMANCE ELECTRICAL LAMINATE FORMULATION

| Ingredients | Range(wt %) | Preferred Amounts(wt %) |
|---|---|---|
| Epoxy Resin | | |
| Bis-A Epoxy Resin | 10-26 | 15-23 |
| Brominated Bis-A Epoxy (TBBADGE) | 9-30 | 13-26 |
| Tetrabromobisphenol A (TBBA) | 7-21 | 11-19 |
| SMA | 10-26 | 15-23 |
| Toughener | 1-5 | 2-4 |
| Methacrylate butadiene styrene core shell particles (Paraloid 2591) | | |
| Accelerator | 0.05-1.0 | 0.2-0.5 |
| BT Resin | 15-50 | 25-40 |
| Filler | 0-20 | 0-10 |

The ingredients are suspended in a DMF, MEK or MEK/DMF solvent in a ratio ranging from about 50-80 wt % solids to 50-20 wt % solvent and preferably about 70 wt % solids to about 30 wt % solvent.

The thermosetting resin compositions of this invention are useful for making prepregs in a continuous process. Prepregs are generally manufactured using a core material such as a roll of woven glass web which is unwound into a series of drive rolls. The web then passes into a coating area where the web is passed through a tank which contains the thermosetting resin system of this invention, solvents and other components. The glass web becomes saturated with the resin in the coating area. The resin saturated glass web is then passed through a pair of metering rolls which remove excess resin from the resin saturated glass web and thereafter, the resin coated web travels the length of a drying tower for a selected period of time until the solvent is evaporated from the web. A second and subsequent coating of resin can be applied to the web by repeating these steps until the preparation of the prepreg is complete whereupon the prepreg is wound onto roll.

Lamination process typically entail a stack-up of one or more prepreg layers between one or two sheets of conductive foil (such as copper foil). Lamination methods and parameters may vary widely, and are generally well known to the person of ordinary skill in the art. In a typical cure cycle, the stack is maintained at a pressure of about 40 psi to about 900 psi and under a vacuum of about 30 in/Hg. The stack temperature is raised from about 180° F. to about 375° F. over a period of about 20 minutes. The stack remains at a temperature of about 375° F. for 75 minutes after which the stack is cooled from a temperature of 375° F. to a temperature to 75° F. over a 20 minute period.

In another process for manufacturing laminates, thermosetting resins of this invention are premixed in a mixing vessel under ambient temperature and pressure. The viscosity of the pre-mix is ~600-1000 cps and can be adjusted by adding or removing solvent from the resin. Fabric substrate (typically but not limited to E glass) is pulled through a dip tank including the premixed resin, through an oven tower where excess solvent is driven off and the prepreg is rolled or sheeted to size, layed up between Cu foil in various constructions depending on glass weave style, resin content & thickness requirements.

The thermosetting resin mix can also be coated directly on Cu substrate (RCC—resin coated Cu) using slot-die or other related coating techniques.

The following examples are illustrative of various aspects of the invention but do not serve to limit its scope.

EXAMPLES

Example 1

Electrical and Thermal Properties

In this example, the electrical and thermal properties of castings of the thermosetting resin compositions according to the invention were measured. The ingredients of the composition and their amounts are listed in Tables 1 and 2. Table 1 is an unfilled resin composition. Table 2 is a filled resin composition. DMF was used as solvent to provide a total solids content of about 67% for the unfilled resin composition and about 71% for the filled resin composition.

TABLE 2

Filled Resin Composition

| Ingredient | Amount (percentage of 100% solids) |
|---|---|
| Epoxy resin | |
| Bis A epoxy | 13% |
| TBBA | 8.5% |
| TBBADGE | 14% |
| SMA | 18% |
| BT resin | 24% |
| 2-ethyl-4-methylimidazole | 0.07% |
| Toughener (Paraloid ®) | 1.9% |
| Fluorescent dye (Uvitex ® OB) | 0.02% |
| Silica filler | 20% |

Physical and electrical properties of the unfilled and filled resin compositions are provided in Table 3. The data show that the resin composition exhibit very good Tg values and provides maximum Dk and Df values of 3.03 and 0.0085, respectively, at high frequency ranges of about 1 GHz.

TABLE 3

Physical and electrical properties of filled and unfilled resin compositions.

| RESIN | CTE Tg-288 (ppm/° C.) | CTE 23-288 (ppm/° C.) | Tg DSC ° C. | DMA Tg G' | Dk @ 1 GHz (after post bake) | Df @ 1 GHz (after post bake) |
|---|---|---|---|---|---|---|
| Unfilled | 193 | 107 | 197 | 175 | 3.43 | 0.0085 |
| filled | 172 | 99.6 | 195 | 187 | 3.03 | 0.0067 |

TABLE 1

Unfilled Resin Composition

| Ingredient | Amount (percentage of 100% solids) |
|---|---|
| Epoxy resin | |
| Bis A epoxy | 17% |
| TBBA | 11% |
| TBBADGE | 17% |
| SMA | 22.5% |
| BT resin | 30% |
| 2-ethyl-4-methylimidazole | 0.08% |
| Toughener (Paraloid ®) | 2.4% |
| Fluorescent dye (Uvitex ® OB) | 0.02% |

It is contemplated that various modifications may be made to the compositions, prepregs, laminates and composites of the present invention without departing from the spirit and scope of the invention as defined in the following claims.

What we claim is:

1. A prepreg comprising:
   a substrate impregnated with a thermosetting resin the thermosetting resin including:
   (1) at least one epoxy resin including at least one co-cross linking agent;
   (2) at least one styrene-maleic anhydride copolymer; and
   (3) from about 15 to about 50 wt % of at least one bis-maleimidetriazine resin.

2. The prepreg of claim 1 wherein thermosetting resin composition of claim 1 including an accelerator.

3. The prepreg of claim 2 wherein the accelerator is an imidazole.

4. The prepreg of claim 1 wherein the thermosetting resin includes a filler.

5. The prepreg of claim 4 wherein the filler is selected from the group consisting of teflon, talc, quartz, ceramics, particulate metal oxides, silica, titanium dioxide, alumina, ceria, clay, boron nitride, wollastonite, and mixtures thereof.

6. The prepreg of claim 1 wherein the thermosetting resin includes:
- an epoxy resin comprising 15-23 weight percent of a bisphenol-A epoxy resin, 13-26 weight percent of brominated bisphenol A diglycidyl ether co-crosslinking agent, and 11-19 weight percent of tetrabromobisphenol A co-crosslinking agent;
- 15-23 weight percent of the at least one styrene-maleic anhydride copolymer;
- 2-4 weight percent of methacrylate butadiene core shell particles;
- 0.2-0.5 weight percent of an accelerator;
- 25-40 weight percent of a bismaleimidetriazine resin; and
- 0-10 weight percent of a filler.

7. The prepreg of claim 1 wherein the substrate is a woven glass material.

8. The prepreg of claim 1 wherein the thermosetting resin composition is at least partially cured.

9. A laminate including one or more pregregs of claim 1 and one or more sheets of conducting foil.

10. The laminate of claim 9 including at least one prepreg positioned between sheets of conducting foil.

11. The laminate of claim 9 including at least one sheet of conducting foil positioned between prepreg sheets.

\* \* \* \* \*